(12) United States Patent
Stroeks et al.

(10) Patent No.: US 9,832,869 B2
(45) Date of Patent: *Nov. 28, 2017

(54) POLYAMIDE FILMS AND PROCESS FOR PREPARATION

(71) Applicant: DSM IP ASSETS B.V., Heerlen (NL)

(72) Inventors: Alexander Antonius Marie Stroeks, Echt (NL); Pim Gerard Anton Janssen, Echt (NL)

(73) Assignee: DSM IP ASSETS B.V., Heerlen (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/910,093

(22) PCT Filed: Jul. 9, 2014

(86) PCT No.: PCT/EP2014/064691
§ 371 (c)(1),
(2) Date: Feb. 4, 2016

(87) PCT Pub. No.: WO2015/018588
PCT Pub. Date: Feb. 12, 2015

(65) Prior Publication Data
US 2016/0183368 A1    Jun. 23, 2016

(30) Foreign Application Priority Data

Aug. 6, 2013  (EP) ..................... 13179429

(51) Int. Cl.
| | |
|---|---|
| *H05K 1/00* | (2006.01) |
| *H05K 3/00* | (2006.01) |
| *C08G 69/26* | (2006.01) |
| *H05K 1/03* | (2006.01) |
| *B29C 55/00* | (2006.01) |
| *B29C 55/12* | (2006.01) |
| *C08J 5/18* | (2006.01) |
| *C08L 77/06* | (2006.01) |
| *B29C 55/04* | (2006.01) |
| *H05K 1/02* | (2006.01) |
| *B29K 77/00* | (2006.01) |

(52) U.S. Cl.
CPC ......... *H05K 1/0346* (2013.01); *B29C 55/005* (2013.01); *B29C 55/04* (2013.01); *B29C 55/12* (2013.01); *C08G 69/26* (2013.01); *C08G 69/265* (2013.01); *C08J 5/18* (2013.01); *C08L 77/06* (2013.01); *H05K 1/028* (2013.01); *H05K 1/0366* (2013.01); *H05K 1/0373* (2013.01); *H05K 3/0064* (2013.01); *B29K 2077/00* (2013.01); *C08J 2377/06* (2013.01); *H05K 1/0393* (2013.01)

(58) Field of Classification Search
None
See application file for complete search history.

(56) References Cited

U.S. PATENT DOCUMENTS

| | | | |
|---|---|---|---|
| 6,747,120 B2 | 6/2004 | Rulkens et al. | |
| 8,778,247 B2 * | 7/2014 | Stroeks | B29C 55/005 |
| | | | 264/172.19 |
| 9,068,042 B2 * | 6/2015 | Stroeks | C08J 5/18 |
| 2012/0024577 A1 * | 2/2012 | Stroeks | B29C 55/005 |
| | | | 174/254 |

FOREIGN PATENT DOCUMENTS

| | | |
|---|---|---|
| WO | WO 2010/081873 | 7/2010 |
| WO | WO 2011/135018 | 11/2011 |

OTHER PUBLICATIONS

International Search Report for PCT/EP2014/064691, dated Oct. 9, 2014, 4 pages.
Written Opinion of the ISA for PCT/EP2014/064691, dated Oct. 9, 2014, 6 pages.

* cited by examiner

*Primary Examiner* — Ana Woodward
(74) *Attorney, Agent, or Firm* — Nixon & Vanderhye P.C.

(57) ABSTRACT

The invention relates to a stretched polymer film made of a polyamide composition comprising a semi-crystalline semi-aromatic polyamide (PPA), wherein the PPA consists of repeat units derived from aromatic dicarboxylic acid comprising at least 80 mole % of terephthalic acid, relative to the total amount of aromatic dicarboxylic acid; and diamine comprising at least 5 mole % 1,4-butanediamine and at least 5 mole % 1,6-hexanediamine, relative to the total amount of diamine, the combined amount of 1,4-butanediamine and 1,6-hexanediamine being at least 60 mole % relative to the total amount of diamine; and 0-2 mole % of other monomeric units, relative to the total amount of aromatic dicarboxylic acid, diamine and other monomeric units. The invention further relates to a process for preparing the polyamide film by melt extrusion and stretching of the film.

17 Claims, No Drawings

POLYAMIDE FILMS AND PROCESS FOR PREPARATION

This application is the U.S. national phase of International Application No. PCT/EP2014/064691 filed 9 Jul. 2014, which designated the U.S. and claims priority to EP Patent Application No. 13179429.9 filed 6 Aug. 2013, the entire contents of each of which are hereby incorporated by reference.

The present invention relates to polyamide films, and a process for the preparation thereof, more particular to biaxially stretched polyamide film and to a process for preparing the polyamide film by melt extrusion in a single screw extruder.

The field of the invention is that of polymer films, more particular polymer films that have good mechanical and thermal properties and can be used in demanding applications such as flexible printed circuit (FPC) films. Herein the film services as a flexible base material for a patterned arrangement of an electrically conductive circuitry and components. The main components of flexible printed circuits (FPCs) are flexible films functioning as carrier layer and thin layers of conductive circuit traces, which may be covered with a flexible cover layer. FPC films can be utilized to interconnect electronic devices—such as the LCD screen and keyboard of a laptop—as a reliable wiring replacement, or can have electronic components directly attached to it via soldering or conductive adhesive, to form a finished pliable circuit board. The growth in surface mount technology (SMT) and the development of conductive adhesives, used to attach such components to circuit boards at relatively low temperatures, has favored the use of flexible substrates.

For low-end FPCs, for example polyester films are being used. However, for more critical and demanding applications, polymer films made from polyimide (PI, such as Kapton) or polyetheretherketone (PEEK) are used. Here the films must be able to withstand the soldering conditions in lead free soldering for the surface mounting of components, which involve soldering temperatures of about 260° C. Advantages of these materials are that films made thereof have very good mechanical properties as well as retention thereof at temperatures as high as used for lead free soldering. However, these materials are expensive and difficult to process.

Heat resistant films may also be used in barrier films comprising a silicon nitride layer. Silicon nitride layers are applied for their high barrier properties e.g. preventing the moisture of the atmosphere to enter into an application. In some applications they need to be applied on a carrier material such a film. Multiple layers can be applied to ensure a good barrier. Mostly vapor deposition is used to deposit silicon nitride on a film, which is normally done at temperatures around 250° C. Being able to apply this this process at higher temperatures will make is possible to achieve good barrier properties with thinner layers of silicon nitride. Thinner layers also are less susceptible for cracking during operation (due to stresses applied to them). Better mechanical properties of the film will furthermore enable a better support for the layers and to move to thinner film layers.

Polyamides, in particular aliphatic polyamides, are more easily processed into films, and polyamide films are widely used for various purposes and in many applications, including packaging materials. Aliphatic polyamides have a too low melting temperature, below 300° C., but semi-aromatic polyamides can have melting temperatures well above 300° C. Mechanical properties of polyamide films can be improved by orientation and stretching the films around or above the glass transition temperature. Polyamide films, also stretched polyamide films, however, suffer from the fact that the mechanical properties above the glass transition temperature, and in particular at elevated temperatures as high as needed for silicon nitride deposition and lead free soldering temperatures, are much lower than the mechanical properties below the glass transition temperature. The inventors have observed that biaxially stretched polyamide films of semi-aromatic polyamides with a melting temperature above 300° C., for example, PA 9T or PA XT/Y6, have a much lower stiffness than an unstretched Kapton film at 260° C.

Another aspect is that polyamide films used for packaging are produced on large scale involve polyamides with relative low melting temperatures. High melting polyamides, as needed for the FPC films, tend to produce films comprising bubbles, in particular when the films are produced in a film production unit with a single-screw extruder. Such bubbles complicate the stretching process, as the bubbles can initiate rupture of the films during stretching.

A first aim of the present invention is to provide a stretched polymer film made of a polyamide composition that has improved mechanical properties at elevated temperature.

A second aim is to provide a process for producing a stretched polymer film having such improved mechanical properties.

A further aim is to provide a polyamide film that can be produced on a single-screw extruder with less bubbles, and which can be used for the production of the stretched polymer film with the said improved mechanical properties.

In a first embodiment of the invention the stretched polymer film is a stretched polymer film made of a polyamide composition comprising a semi-crystalline semi-aromatic polyamide as described in claim 1.

In a second embodiment of the invention the stretched polymer film is produced by a process wherein the composition comprising the said semi-crystalline semi-aromatic polyamide is subjected to film preparation step and a stretching step as described in claim 11.

In a third embodiment of the invention a polymer film made of a polyamide composition comprising a semi-crystalline semi-aromatic polyamide as described in claim 12 is provided.

The effect of the stretched polyamide film according to the invention is that the film shows very good mechanical properties, in particular above the glass transition temperature, close to those of Kapton film and much better than that of other semi-crystalline semi-aromatic polyamides based on terephthalic acid, or based on a combination of terephthalic acid and adipic acid. This is illustrated with the results further below.

The stretched polymer film according to the invention can be produced by a process wherein the composition comprising the said semi-crystalline semi-aromatic polyamide is subjected to a film preparation step and a stretching step. The semi-crystalline semi-aromatic polyamide has a glass transition temperature (Tg) and a melting temperature (Tm).

During the film preparation the polymer composition comprising the PPA is heated to a temperature above Tm and melt-extruded through a slit die to form an extruded polymer layer, and the extruded polymer layer is quenched to a temperature below Tg, thereby forming a polymer film, and the polymer film is collected. The quenching may be performed by leading the extruded polymer layer in a liquid cooling medium having a temperature below Tg or over a chilling role having a temperature below Tg, Quenching favors inhibition of crystal growth and formation of a transparent film, which is more easily stretched or thermoformed.

The thus obtained film is stretched at a temperature (T-stretch) below Tm and optionally subjected to a heat setting step at a temperature between T-stretch and Tm.

The stretching can be performed in a single or in a multiple stretching step method. In a multiple stretching step method a first stretching is suitably done at a temperature T-stretch-1 around Tg, preferably within a range from (Tg−20° C.) to (Tg+20° C.). A second stretching step is performed at a temperature T-stretch-2 that is in the range from T-stretch-1+20° C. upto T-stretch-1+50° C. but below Tm. An eventual third stretching step is performed at a temperature T-stretch-3 in the range from T-stretch-2+20° C. upto T-stretch-2+50° C. but below Tm. In a single stretching step, the stretching is performed at a temperature between Tg and Tm, more preferably at a temperature between Tg and Tg+60° C., still more preferably at a temperature between Tg and Tg+40° C. After the stretching step(s), the film is suitably subjected to a heat-setting step. Herein the film is heated under full mechanical constrained conditions or allowing some geometrical relaxation at a temperature between the temperature of the last stretching step and Tm. Preferably this temperature is above the temperature for the lead free soldering. Also preferably this temperature is in the range between Tm−30° C. and Tm, more preferably at a temperature between Tm−15° C. and Tm, and subsequently the film is cooled to below Tg. The duration of the heat-setting step is suitably in the range between 0.5 and 30 seconds, for example between 5 and 20 seconds. The film may be kept at the heat setting temperature for a duration longer than 30 seconds; however, this does not bring further significant improvement. The advantage of heat setting is that the physical properties and dimensions of the film are better retained when heated again to a temperature above Tg.

The stretched polymer film according to the invention suitably is a unidirectionally stretched film, also referred to as uniaxially stretched film, or a biaxially stretched film, also referred to as planar stretched film. This planar stretching may occur in a sequential order wherein stretching first occurs in machine direction (MD) followed by a stretching step in transverse (TD) direction. MD stretching may occur by leading the film over different roller sets, while heating the film, wherein stretching occurs by a difference in relative rotation speed of the different roller sets. TD stretching is e.g. performed downstream in an air oven system. TD stretching may occur by moving the film in a tenter frame device in which the films is clamped at the sides. By the specific geometry of the tenter frame device the film is stretched in perpendicular direction by moving the film through the device. Herein the film can be stretched in a semi-continuous process.

Planar stretching may also occur in a manner in which in-plane stretching of the films occurs in both planar directions simultaneously. This can be performed in specific tenter frame systems designed in such a way that stretching occurs indeed in both directions simultaneously. This process does not lend itself to be operated in a continuous manner. Heating occurs normally by hot air.

Another class of biaxial stretching processes is formed by the continuous tubular stretching processes. A prominent example is the double bubble process. In this process usually a melt of a polymer is blown in into a tubular film in the melt. This film can then be quenched by for example a cold water bath and in a stretching step this tubular film is blown to a larger bubble at temperatures above Tg and below Tm as indicated before. This stretching step reflects a biaxial stretching step since the diameter of the bubble is increased as well as the length of the bubble.

The biaxially stretched product might be in the form of a film, optionally combined with other films forming a multilayer film. This can for example be accomplished by lamination to form the multilayer film end product.

The biaxial stretched film may be a balanced film, i.e. with orientation roughly equal in both directions, or an unbalanced film. Preferably, the stretched film is a balanced film.

The stretching ratio of the film may be varied over a wide range, and it has been observed that the stretching ratio for unidirectionally stretched film can be as high as 3.5 and beyond, up to around 6, and for balanced biaxially stretched film as high as about 3.0×3.0. Suitably, the unidirectionally stretched film has undergone a stretching step with a stretching ratio of at least 1.5, preferably at least 2. Also suitably, the biaxially stretched film has undergone a stretching step with a stretching ratio of at least 1.5×1.5, preferably at least 2×2.

The effect of the stretching is that the film becomes oriented and anisotropic in its properties, with specific properties, such as mechanical strength being enhanced in the uniaxial stretching direction or in the two planar stretching directions. Suitably, the stretched polymer film according to the invention has an anisotropic property with an anisotropic ratio for the property measured in a planar stretched direction relative to the property measured in a perpendicular off-plane direction. Another example of such an anisotropic property is thermal expansion, which decreases in the stretching direction and increases in the off-plane direction. Suitably, the film according to the invention has an anisotropy ratio for the thermal expansion off-plane divided by the thermal expansion in-plane of at least 1.5. More preferably the ratio is at least 3, still more preferably at least 5.

Herein the in-plane thermal expansion of the film is the average in-plane thermal expansion per degree Celsius, measured by the method according to ASTM D969-08 in the temperature range from 20° C. upto and including 100° C. The off-plane thermal expansion is herein the average off-plane thermal expansion per degree Celsius in the temperature range from 20° C. upto and including 100° C., measured by accurate film thickness measurement as a function of temperature with a film precision thickness gauge using a stack of 10 film layers.

The film according to the invention may have a thickness varying over a broad range. The range will depend on the thickness of the film before stretching and the stretching ratio applied. The thickness may be as high as 500 μm (micrometer) or even higher, while still having good high temperature properties. The thickness may be as low as 1 μm or lower. Below 8 μm the stretching and handling is very difficult and is often leading to film rupture. Preferably the thickness is in the range of 8-200 μm. The more preferred thickness is in the range of 8-150 μm, or even 8-100 μm, or still more preferred 8-60 μm.

The film according to the present invention is made of a polyamide composition comprising a semi-crystalline semi-aromatic polyamide, which is denoted herein as PPA. The PPA used in stretched film according to the invention consists of repeat units derived from aromatic dicarboxylic acid comprising at least 80 mole % of terephthalic acid, relative to the total amount of aromatic dicarboxylic acid; and diamine comprising at least 5 mole % 1,4-butanediamine and at least 5 mole % 1,6-hexanediamine, relative to the total amount of diamine, the combined amount of 1,4-butanediamine and 1,6-hexanediamine being at least 60 mole % relative to the total amount of diamine; and 0-2 mole % of other monomeric units, relative to the total amount of aromatic dicarboxylic acid, diamine and other monomeric units.

Aromatic dicarboxylic acids that can be used next to terephthalic acid include isophthalic acid, naphthalene dicarboxylic acid, and/or diphenylene dicarboxylic acid. Preferably, the aromatic dicarboxylic acid comprises at least 90 mole % of terephthalic acid, and eventually fully consists of terephthalic acid.

To lower the melting temperature of the PPA other diamines may be added next to 1,4-butanediamine and 1,6-hexanediamine, in an amount of at most 40 mole %, relative to the total amount of diamine. X. Preferably the amount is in the range of 0-40 mole %, preferably 0-30 mole %, for example 5-25 mole %.

Examples of suitable diamines are linear aliphatic diamines such as 1,2-ethanediamine, 1,3 propanediamine, 1,5-pentanediamine, 1,8-octanediamine, 1,9-nonanediamine or 1,10-decanediamine or branched aliphatic diamines such as 2-methyl 1,5-pentane diamine, or cycloaliphatic diamines such as 1,4-cyclohexanediamine.

Preferably, the PPA has a melting temperature (Tm) (define Tm and method) of at least 315° C. (degrees Celsius) and even more preferably of at least 320° C. The melting temperature Tm of the PPA can for instance be between 325° C. and 360° C.

With the melting temperature is herein understood the temperature, measured by the DSC method according to ISO-11357-1/3, 2011, on pre-dried samples in a nitrogen atmosphere with heating and cooling rate of 10° C./min. Herein Tm is calculated from the peak value of the highest melting peak in the second heating cycle.

With the glass transition temperature (Tg) is herein understood the temperature, measured by the DSC method according to ISO-11357-1/2, 2011, on pre-dried samples in a nitrogen atmosphere with heating and cooling rate of 10° C./min. Herein Tg is calculated from the value at the peak of the first derivative (with respect of time) of the parent thermal curve corresponding with the inflection point of the parent thermal curve in the second heating cycle.

The PPA may comprise monomeric units other than those derived from aromatic dicarboxylic acid and diamine. These may include one or more components selected from aliphatic dicarboxylic acids, amino-functional carboxylic acids, mono-functional components such as mono-functional amines and mono-functional carboxylic acids, poly-functional compounds, i.e. with three or more functional groups, such as tri-functional amines and tri-functional carboxylic acids. The aliphatic dicarboxylic acid can for instance be adipic acid and/or sebacic acid. The amino-functional carboxylic acids can for instance consist of ε-aminocaproic acid, 11-amino-1-undecanoic acids and/or 12-amino1-dodecanoic acid or their respective lactams caprolactam, undecane-11-lactam and laurolactam. Mono-functional amine can be, for instance, stearylamine, dodecylamine and/or decylamine. Mono-functional carboxylic acids can for instance consist of stearic acid, benzoic acid, acetic acid and/or propanoic acid. An example of a tri-functional amine is for instance bis(hexamethylene)triamine. For the tri-functional carboxylic acid can for instance trimesic acid be used.

The total amount of such other monomeric units is limited to 2 mole %, relative to the total amount of aromatic dicarboxylic acid, diamine and other monomeric units.

Preferably, the PPA comprises less than 0.20 mole % of poly-functional monomeric units relative to the total amount of aromatic dicarboxylic acid, diamine and other monomeric units. With a higher amount of poly-functional monomeric units the PPA is less good processable.

In a preferred embodiment the PPA in the stretched polymer film has a relative viscosity (RV) of at least 1.75. Herein, the relative viscosity (RV) is measured in sulphuric acid, concentration 1 gram in 100 ml 96% sulfuric acid at 25° C., by the method according to ISO 307, fourth edition. The advantage is that during the film preparation on a single screw extruder the occurrence of bubble formation is reduced. More preferably, the relative viscosity (RV) of at least 1.90.

An example of a PPA that can be used in the process and film according to the invention is PA 6T/4T, i.e. is a copolyamide consisting of 1,6-hexanediamine, 1,4-butanediamine and terepthalic acid wherein no other diamines or other aromatic dicarboxylic acids are used. Such semi-aromatic polyamides are known from U.S. Pat. No. 6,747,120. A problem of polyamide 6T/4T is that under standard processing conditions it is difficult to prepare such a polyamide with sufficiently high molecular weight and sufficiently high viscosity. Though it is mentioned in U.S. Pat. No. 6,747,120 that higher molecular weights, and thereby higher viscosities, may be achieved by using acid or amine monomers with functionalities of 3 and higher, the use of such monomers also introduces the risk of crosslinking and gelation of the polyamide during polymerization and/or during melt processing. The viscosity of PA 6T/4T polymers mentioned in U.S. Pat. No. 6,747,120 is in the range of 1.35-1.58. In connection with the present invention it is noted here that polyamides like PA 6T/4T and copolymers comprising other diamines corresponding with the present invention with sufficiently high molecular weight corresponding with an RV of 1.75 or higher can be prepared by direct solid-state polymerization without the risk of gelation.

This polymer with the RV of 1.75 or higher is advantageously used for making an extruded polymer polyamide film and making a stretched polymer film thereof.

The polymer composition used for the stretched polymer film according to the invention comprises the PPA described above. The said film and composition may comprise one or more further components. However, the PPA is suitably present in an amount of at least 60 wt. %, preferably at least 80 wt. %, more preferably 90-100 wt. %, relative to the total weight of the composition.

The film may comprise one or more component selected from other polyamides, other polymers, fibrous reinforcing materials, inorganic fillers, flame retardants, and auxiliary additives, such stabilizers, impact modifiers, colorants, pigments, plasticizers, and process aids like nucleating agents, anti-blocking agents, mold release agents and anti-slip agents. Such further components are suitably chosen such that the mechanical properties at elevated temperature are not deteriorated in significant extent.

The composition may comprise, for example, other polyamides, however, the amount thereof is suitably limited, for example, other semi-crystalline semi-aromatic polyamide in an amount of at most at most 25 wt. %, and preferably 0-10 wt. %; amorphous semi-aromatic polyamide in an amount of at most 25%, and preferably 0-10 wt. %, and/or semi-crystalline aliphatic polyamide in an amount of at most 5 wt. %, and preferably 0-2.5 wt. %, relative to the total weight of the composition. The combined amount thereof shall be limited to at most 40 wt. %, preferably at most 10 wt. % and still more preferably 0-10 wt. %.

Examples of semi-crystalline semi-aromatic polyamide are PA 8T, PA 9T, PA 10T or copolymers thereof such as PA 6T, PA10T/6T. A suitable amorphous semi-aromatic polyamide is PA6I/6T.

The polymer composition may also comprise additional thermoplastic polymers other than polyamide, for instance polyphenylene sulfide (PPS), liquid crystal polymer (LCP), aramid resin, polyether ether ketone (PEEK), polyether imide (PEI), polyimide (PI) and optionally a compatibilizing agent. Preferably, the amount of additional thermoplastic polymer is at most 20 wt. %, and preferably 0-10 wt. %, even more preferably 0-5 wt. %, relative to the total weight of the composition.

Fibrous reinforcing agents, inorganic fillers and flame retardants are suitably present in a combined total amount of at most 20 wt. %, preferably at most 10 w.t %, and most suitably 0-5 wt. %.

Auxiliary additives are suitably present in a combined total amount of at most 10 wt. %, preferably 0-5 w.t %, and most suitably 0-2.5 wt. %.

Whereas the film according to the invention may comprise different other components next to the PPA, such other components are preferably present in a total amount of, for example at most 20 weight percent (wt. %), preferably at most 10 wt. % or even better at most 5 wt. %, relative to the total weight of the polymer composition, and suitably chosen such that the mechanical properties at elevated temperature are not deteriorated in significant extent. Accordingly, the PPA is preferably present in an amount of at least 80 wt. %, more preferably 90 wt. %, still more preferably at least 95 wt. %, relative to the total weight of the polymer composition.

The invention also relates to a polymer film made of a polyamide composition comprising a semi-crystalline semi-aromatic polyamide (PPA), with a composition as in the stretched film and having a relative viscosity RV of 1.75 or higher. This film is advantageously made on a single screw extruder and can be used for making a stretched polymer film thereof. The PPA suitably has a melting temperature (Tm), of at least 315° C. and a relative viscosity (RV) of at least 1.75. Also suitably, the PPA is present in an amount of at least 60 weight percentage (wt. %), relative to the total weight of the polymer composition. The polymer film suitably has a thickness in the range of 10 μm (micrometer)-1 mm (millimeter).

The invention also relates to the use of a stretched polymer film according to the invention or obtainable by the process according to the invention, or any specific or preferred embodiment thereof in electrical and electronic applications.

The PPA-film may be used, for example, as a flexible printed circuit (FPC) film, and be provided with a pattern of conductive tracks and subjected to a heat soldering process. In a particular embodiment, the film is provided with a pattern of conductive tracks by applying silver printing with an ink comprising silver particles followed by heat sintering of the silver particles. The film may also be provided with an inorganic material, such as a silicon nitride, silicon oxide, titanium dioxide or aluminium deposit layer, and be used, for example, as a barrier film or as a carrier film for OLED displays and OLED lighting devices. In OLEDs the organic LED needs to be shielded from ambient conditions. The film may be used as a surface protective sheet and surface sealing sheet for sealing for instance the back surface of the solar cell module.

The invention is further illustrated with the following examples and comparative experiments.

| Materials |
|---|
| M1 PA 6T/4T (60/40), RV 2.1, Tg 151° C. and Tm 338° C. |
| M2 PPA based on 85 mole % terephthalic acid and 15 mole % adipic acid, 60 mole % 1,6-hexanediamine and 40 mole % 1,4-butanediamine, RV 2.3, Tg 125° C. and Tm 325° C. |
| M3 PA 9T, RV 2.1, Tg 125° C. and Tm 306° C. |
| M4 Kapton film, none stretched |
| M5 PPA based on 92.5 mole % terephthalic acid and 7.5 mole % adipic acid, 60 mole % 1,6-hexanediamine and 40 mole % 1,4-butanediamine, RV 2.3, Tg 136° C. and Tm 331° C. |

Preparation PA 6T/4T

A mixture of 1225 g of terephthalic acid was charged into a 10 liter baffled flask, attached to a rotary evaporator, equipped with a heated diamine dosing vessel was kept under an inert nitrogen atmosphere and mixed by rotation at 5 rpm. The rotating flask was partially submerged in a water bath, maintained at 60° C. to remove the heat of neutralization. A liquid mix of 528 g 1,6-hexane diamine and 286 g 1,4-butane diamine of 60° C. was added drop-wise to the acids in 4 hours under constant rotation. After dosing, the reaction mixture was stirred by rotation at a water batch temperature of 60° C. for another 30 minutes. After the experiment salt in the form of loose powder was obtained.

This recipe was repeated several times and the batches were mixed to obtain a homogeneous powder mixture.

A 50 liter tumble drier was charged with 10 kg of the salt. It was inertized by evacuation to 50 mbar and filling with nitrogen and repeating this 5 times. A nitrogen purge of 10 g/h was used. Then the mixture was heated in 2 hours to 200° C. and subsequently in 10 hours to 250° C., while allowing the reaction water to leave the tumble drier. Then the nitrogen stream was stopped and a mix of 130 g 1,6-hexane diamine and 60 g 1,4-butane diamine of 60° C. was added during 1 hour, while keeping the temperature at 250° C. The mix was reacted another 4 hours to reach a RV of 2.1. Then a nitrogen stream of 1 kg $N_2$/hour was applied and the material cooled to room temperature. Approximately 8.5 kg of a white powder was obtained with a melting temperature Tm of 338° C. and a glass transition temperature Tg of 151° C.

Compounding

The polyamide compositions were prepared by melt mixing on a Berstorff ZE25/48 UTX (a co-rotating twin-screw extruder) operating at 350 rpm and using a wall temperature setting of 350° C. All polymeric materials and additives were fed to the feed-throat of the extruder. The settings used resulted in a temperature of the melt exiting the die-head of approximately 360° C. The mean residence time of the molten polymers in the extruder was about 30 seconds.

Each of the polyamides comprised around 0.5-1.0 wt. % of a standard additive package comprising processing aids and heat stabilizers. Melting temperature (Tm), glass transition temperature (Tg), and relative viscosity (RV) mentioned herein were measured by the methods described below.

Methods

Viscosity: Relative Viscosity (RV)

The measurement of the relative viscosity (RV) was performed according to ISO 307, fourth edition. For the measurements pre-dried polymer samples were used the drying of which was performed under high vacuum (i.e. less than 50 mbar) at 80° C. during 24 hrs. Determination of the relative viscosity was done at a concentration of 1 gram of polymer in 100 ml 96% sulfuric acid at 25.00±0.05° C.

DSC Measurements: Tg, Tm and Melting Enthalpy

The melting temperature was herein measured by the DSC method according to ISO-11357-1/3, 2011, on pre-dried samples in an $N_2$ atmosphere with heating and cooling rate of 10° C./min. Herein Tm has been calculated from the peak value of the highest melting peak in the second heating cycle.

The glass transition temperature (Tg) was herein understood the temperature, measured by the DSC method according to ISO-11357-1/2, 2011, on pre-dried samples in an $N_2$ atmosphere with heating and cooling rate of 10° C./min. Herein Tg has been calculated from the value at the peak of the first derivative (with respect of time) of the parent thermal curve corresponding with the inflection point of the parent thermal curve in the second heating cycle.

In Plane Coefficient of Humidity Expansion ($CHE_{ip}$)

The $CHE_{ip}$ was determined as follows: a film sample of 5×5 cm was cut out of a pre-dried film conditioned for 24 hours at 25° C. at 10% RH. The sample was placed in a conditioning cabinet such that they were smoothly clamped and pending free and conditioned at 25° C. and 50% RH for 24 hours. The dimensions of the so-conditioned sample were measured. The sample was placed again in the conditioning cabinet in the same manner and conditioned for another 24 hours at 25° C. and 80% RH. The dimensions of the so-conditioned samples were measured. The dimensions of the samples were measured both in the length and the width direction. From the measured dimensions the humidity dependent expansion coefficient of the individual samples is calculated according to the formula:

$$CHE_{individual\ sample,\%\ RH} = \{(L_1-L_0)/(R_1-R_0)\}$$

wherein R0 is the RH at which the dimension L0 was measured prior to the conditioning procedure at R1, and R1 is the RH at which the sample was conditioned and after which conditioning the dimension L1 was measured, L0 is the dimension measured prior to the conditioning at R1 and L1 is the dimension measured after the conditioning at R1.

The $CHE_{ip}$ of a film was calculated by averaging the CHE values in the two directions of the individual sample.

In Plane Thermal Expansion Coefficient $TEC_{ip}$,

The in plane thermal expansion coefficient $TEC_{ip}$ was measured with the method according to ASTM D969-08, measured in plane over the temperature range of 20° C.-100° C., respectively above the glass transition temperature (Tg) of the polyamide film. The off-plane thermal expansion in the temperature range from 20° C. upto and including 100° C. was measured with a film precision thickness gauge using a stack of 10 film layers.

Processing

The compounding materials were dried prior to processing. All film materials as produced were packed in alumina bags directly after production to prevent contact with moisture. The polyamide films were prepared by a film cast extrusion process. A single screw extruder (screw diameter 30 mm, L/D=30) was connected to a feed block with a slot die with adjustable die-lip. The feeding rate of polyamide and forming of the melt was such that the residence time of the polymer melt in the melt extrusion zones, feed block and die was about 3 minutes. The length of the slot die was 300 mm and the die-width was 0.8 mm. The extruder was fed with the polyamide material. The film was taken up by and cooled on a chill role with a temperature of 17° C. Furthermore, an air knife was applied. The distance between die and the position where the film touched the chill role was about 1 to 1.5 cm. The thickness of the obtained film was about 80 μm unless specified otherwise and was regulated by the feeding rate and the chill role winding speed, thereby affecting the drawdown ratio between the chill role winding speed and the extrusion speed. When two polyamides or a masterbatch were used, these were added to the hopper as a dry blend of pellets.

Biaxial Stretching

Biaxial film stretching was performed in a batch-wise Iwamoto biaxial stretching device positioned in an air convection oven. The films with areal dimensions of typically 10 cm*10 cm were mechanically clamped at the film sides in this device and consequently heated to the stretching temperature as indicated for each material in table 1. The film is stretched simultaneously at 15 mm/s in both planar directions and the maximum degree of stretching is determined as the maximum degree of stretching at which rupture of the film does not occur. The stretched film is allowed to cool down and taken out of the stretching device.

Heat Setting

The biaxially stretched film with maximum degree of stretching is mechanically clamped to prevent in-plane dimensional change during heat setting. Heat setting is performed by positioning the mechanically clamped film in an oven with nitrogen purge. The film is annealed for 12 minutes at the desired anneal temperature.

DMA Measurements

The dynamic mechanical analyses on films were carried out in accordance with ASTM D5026 using a TA RSA-III test system at a frequency of 1 Hz and at a heating rate of 5° C./min under dry conditions. During the measurements, the storage modulus (E') was determined as a function of temperature. Dogbone samples are cut out of the film and clamped in the device. Typical initial distance between clamps is 25 mm, width of the film sample is typically 3 mm. Samples are cut in one of the two stretching directions. The direction does not matter since the degree of stretching is identical in both planar directions.

TABLE 1

Overview of experiments, materials and processing conditions used, and in-plane thermal expansion coefficients (CTE in ppm/K) in a temperature range below and above Tg for films. Mechanical properties of Example 1 and Comparative Experiments A-C

| | | Stretching degree & temperature | Heat set time (min) & temperature | CTE in-plane < Tg (ppm/° C.) | CTE in-plane > Tg (ppm/° C.) | CTE anisotropy ratio |
|---|---|---|---|---|---|---|
| EX 1 | M1 | 2.8 × 2.8 @150° C. | 12' 300° C. | 16 | 16 | >4 |
| CE A | M2 | 2.8 × 2.8 @125° C. | 12' 300° C. | 20 | 20 | >4 |
| CE B | M3 | 2.7 × 2.7 @130° C. | 12' 290° C. | 14 | 17 | >4 |
| CE C | M4 | Unstretched | n.a. | 20 | | |
| CE D | M5 | 2.8 × 2.8 @135° C. | 12' 300° C. | 19 | 19 | >4 |

TABLE 2

Tensile storage modulus (MPa) for films of Example 1 and
Comparative Experiments A-C at different temperatures

|      |    | 50° C.      | 200° C.     | 250° C.     | 270° C.     |
|------|----|-------------|-------------|-------------|-------------|
| EX 1 | M1 | $5.5 * 10^3$ | $1.5 * 10^3$ | $1.1 * 10^3$ | $1.0 * 10^3$ |
| CE A | M2 | $6.0 * 10^3$ | $5.5 * 10^2$ | $3.0 * 10^2$ | $2.1 * 10^2$ |
| CE B | M3 | $3.0 * 10^3$ | $4.0 * 10^2$ | $2.2 * 10^2$ | $1.6 * 10^2$ |
| CE C | M4 | $3.2 * 10^3$ | $2.1 * 10^3$ | $1.9 * 10^3$ | $1.8 * 10^3$ |
| CE D | M4 | $5.8 * 10^3$ | $9.5 * 10^2$ | $6.2 * 10^2$ | $5.1 * 10^2$ |

The above results show that the film of Example 1 according to the invention retains its mechanical properties much better above Tg than the polyamide films of Comparative Examples A, B and D. The film of Example 1 has a tensile storage modulus (E') around 260° C. which is only a factor about 1.8 smaller than the loss modulus of Kapton (Comparative Example C) at the corresponding temperatures. The films of Comparative Examples A and B, made from other semi-crystalline semi-aromatic polyamides, show values for the loss modulus above Tg which are a factor 6-7, respectively 8-11 smaller than the loss modulus of Kapton (Comparative Example C) at temperatures. Even the film of Comparative Example D shows a difference of a factor 3 or more at around 260° C. This in contrast to the values for the storage modulus below Tg, which for Example 1 and Comparative Example A are above the value for Kapton (Comparative Example C) and about the same.

The invention claimed is:

1. A stretched polymer film made of a polyamide composition comprising a semi-crystalline semi-aromatic polyamide (PPA), wherein the PPA consists of repeat monomeric units derived from:
   aromatic dicarboxylic acid comprising at least 90 mole % of terephthalic acid, relative to the total amount of aromatic dicarboxylic acid;
   diamine comprising at least 5 mole % 1,4-butanediamine and at least 5 mole % 1,6-hexanediamine, relative to the total amount of diamine, the combined amount of 1,4-butanediamine and 1,6-hexanediamine being at least 60 mole % relative to the total amount of diamine; and
   0-2 mole % of other monomeric units, relative to the total amount of aromatic dicarboxylic acid, diamine and other monomeric units.

2. The stretched polymer film according to claim 1, wherein the film is a unidirectionally stretched film or a biaxially stretched film.

3. The stretched polymer film according to claim 2, wherein the film is a unidirectionally stretched film that has undergone a stretching step with a stretching ratio of at least 1.5.

4. The stretched polymer film according to claim 3, wherein the stretching ratio is at least 2.

5. The stretched polymer film according to claim 2, wherein the film is a biaxially stretched film that has undergone a stretching step with a stretching ratio of at least 1.5×1.5.

6. The stretched polymer film according to claim 5, wherein the stretching ratio is at least 2×2.

7. The stretched polymer film according to claim 1, wherein the film has an anisotropic thermal expansion ratio determined by the average thermal expansion in the temperature range from 20° C. up to and including 100° C. measured in a stretched direction divided by the average thermal expansion in the temperature range from 20° C. up to and including 100° C. measured in off-plane direction, of at least 1.5.

8. The stretched polymer film according to claim 1, wherein the film has a thickness in the range of 1-500 μm.

9. The stretched polymer film according to claim 1, wherein the PPA has a melting temperature (Tm), measured by the DSC method according to ISO-11357-1/3, 2011, of at least 315° C.

10. The stretched polymer film according to claim 1, wherein the PPA has a relative viscosity (RV) of at least 1.75, wherein the RV is measured in sulphuric acid, concentration 1 gram in 100 ml 96% sulfuric acid at 25° C., by the method according to ISO 307, fourth edition.

11. The stretched polymer film according to claim 1, wherein the PPA comprises polyfunctional monomeric units other than the aromatic dicarboxylic acid and diamine monomeric units in an amount of less than 0.20 mole %, relative to the total amount of the aromatic dicarboxylic acid units, the diamine units and the other monomeric units.

12. The stretched polymer film according to claim 1, wherein the PPA is present in an amount of at least 60 weight percent (wt. %), relative to the total weight of the polymer composition.

13. A flexible printed circuit (FPC) which comprises the stretched polymer film of claim 1.

14. A process for the preparation of a flexible printed circuit (FPC), wherein the process comprises providing the stretched polymer film according to claim 1 with a pattern of conductive tracks and subjecting the polymer film to a heat soldering process.

15. A process for producing a stretched polymer film, comprising steps of:
   (1) forming an extruded polymer layer by heating and melt-extruding through a slit die a semi-aromatic polyamide (PPA) polymer composition having a glass transition temperature (Tg) and a melting temperature (Tm) consisting of repeat units derived from:
      (i) aromatic dicarboxylic acid comprising at least 90 mole % of terephthalic acid, relative to the total amount of aromatic dicarboxylic acid;
      (ii) diamine comprising at least 5 mole % 1,4-butanediamine and at least 5 mole % 1,6-hexanediamine, relative to the total amount of diamine, the combined amount of 1,4-butanediamine and 1,6-hexanediamine being at least 60 mole % relative to the total amount of diamine; and
      (iii) 0-2 mole % of other monomeric units, relative to the total amount of aromatic dicarboxylic acid, diamine and other monomeric units;
   (2) quenching the extruded polymer layer to a temperature below Tg, thereby forming a polymer film, and thereafter collecting the polymer film;
   (3) stretching the polymer film at a temperature (T-stretch) below Tm; and optionally
   (4) subjecting the polymer film to a heat setting step at a temperature between T-stretch and Tm.

16. A polymer film made of a polyamide composition comprising a semi-crystalline semi-aromatic polyamide (PPA), wherein the PPA consists of repeat monomeric units derived from:
   aromatic dicarboxylic acid comprising at least 90 mole % of terephthalic acid, relative to the total amount of aromatic dicarboxylic acid;
   diamine comprising at least 5 mole % 1,4-butanediamine and at least 5 mole % 1,6-hexanediamine, relative to the total amount of diamine, and the combined amount of 1,4-butanediamine and 1,6-hexanediamine being at least 60 mole % relative to the total amount of diamine; and 0-2 mole % of other monomeric units, relative to the total amount of aromatic dicarboxylic acid, diamine and other monomeric units, wherein the PPA has a melting temperature (Tm), measured by the DSC method according to ISO-11357-1/3, 2011, of at least 315° C. and a relative viscosity (RV), measured in sulphuric acid, concentration 1 gram in 100 ml 96% sulfuric acid at 25° C., by the method according to ISO 307, fourth edition, of at least 1.75, and wherein the PPA is present in an amount of at least 60 wt. %, relative to the total weight of the polymer composition.

17. The polymer film according to claim 16, wherein the film has a thickness in the range of 10 μm-1 mm.

* * * * *